(12) United States Patent
Song et al.

(10) Patent No.: US 11,219,132 B2
(45) Date of Patent: Jan. 4, 2022

(54) FLEXIBLE DISPLAY DEVICE

(71) Applicant: LG ELECTRONICS INC., Seoul (KR)

(72) Inventors: Insu Song, Seoul (KR); Jaewook Kim, Seoul (KR); Sungchul Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/868,458

(22) Filed: May 6, 2020

(65) Prior Publication Data

US 2021/0185835 A1 Jun. 17, 2021

(30) Foreign Application Priority Data

Dec. 13, 2019 (WO) ................ PCT/KR2019/017662

(51) Int. Cl.
*H05K 5/00* (2006.01)
*H05K 5/02* (2006.01)

(52) U.S. Cl.
CPC ......... *H05K 5/0017* (2013.01); *H05K 5/0004* (2013.01); *H05K 5/0221* (2013.01)

(58) Field of Classification Search
CPC .. H05K 5/0017; H05K 5/0004; H05K 5/0221; G06F 1/1652
See application file for complete search history.

(56) References Cited

U.S. PATENT DOCUMENTS

| | | | | |
|---|---|---|---|---|
| 9,286,812 B2* | 3/2016 | Bohn | ................ | H04M 1/0268 |
| 10,963,014 B1* | 3/2021 | Park | ................ | G06F 1/1679 |
| 10,976,775 B1* | 4/2021 | Cha | ................ | H05K 7/1401 |
| 2012/0162876 A1* | 6/2012 | Kim | ................ | H04M 1/0237 |
| | | | | 361/679.01 |
| 2012/0314400 A1* | 12/2012 | Bohn | ................ | G06F 1/1652 |
| | | | | 362/97.1 |

(Continued)

FOREIGN PATENT DOCUMENTS

| KR | 101454241 | 10/2014 |
|---|---|---|
| KR | 1020160127277 | 11/2016 |
| KR | 1020160141255 | 12/2016 |

OTHER PUBLICATIONS

PCT International Application No. PCT/KR2019/017662, Notification of Transmittal of The International Search Report and the Written Opinion of the International Searching Authority, or Declaration dated Sep. 11, 2020, 10 pages.

*Primary Examiner* — Hung S. Bui
*Assistant Examiner* — Sagar Shrestha
(74) *Attorney, Agent, or Firm* — Lee, Hong, Degerman, Kang & Waimey PC

(57) ABSTRACT

The present disclosure relates to a flexible display device including a first body; a second body configured to be relatively movable with respect to the first body; a flexible display disposed on a front surface of the first body and a rear surface of the second body, respectively, and configured to vary in size of areas that are exposed to the front surface of the first body and to the rear surface of the second body as the first body and the second body are relatively moved; and a rotating bending bar disposed in at least one of the first body and the second body, and rotated while the first body and the second body are moved to couple the first body and the second body.

17 Claims, 11 Drawing Sheets

(56) References Cited

U.S. PATENT DOCUMENTS

| | | | |
|---|---|---|---|
| 2013/0058063 A1* | 3/2013 | O'Brien | G06F 1/1652 |
| | | | 361/807 |
| 2014/0031088 A1 | 1/2014 | Nakamura et al. | |
| 2016/0081204 A1* | 3/2016 | Park | H04M 1/0268 |
| | | | 361/807 |
| 2016/0316575 A1* | 10/2016 | Lee | H01L 27/323 |
| 2018/0014417 A1* | 1/2018 | Seo | H05K 1/0203 |
| 2018/0102072 A1* | 4/2018 | Lee | G09G 3/20 |
| 2019/0141849 A1 | 5/2019 | Xu et al. | |
| 2020/0315036 A1* | 10/2020 | Ahn | G06F 1/1652 |
| 2020/0348727 A1* | 11/2020 | Lee | G06F 1/1626 |
| 2020/0363841 A1* | 11/2020 | Kim | G06F 1/1675 |

\* cited by examiner (a)

(b)

(a)

(b)

(a)

(b)

FLEXIBLE DISPLAY DEVICE

CROSS-REFERENCE TO RELATED APPLICATIONS

Pursuant to 35 U.S.C. § 119(a), this application claims the benefit of earlier filing date and right of priority to PCT Application No. PCT/KR2019/017662, filed on Dec. 13, 2019, the contents of which is incorporated by reference herein in its entirety.

TECHNICAL FIELD

The present disclosure relates to a flexible display device having a flexible display that can be deformed by an external force.

BACKGROUND ART

A portable electronic device (hereinafter, a mobile terminal) such as a communication terminal, a multimedia device, a portable computer, a game player, and a photographing device is provided with a display to display image information. A mobile terminal may also have a folding structure that can be folded into a smaller size for convenience of portability. In this type of electronic device, two bodies are connected by a folding structure (e.g., a hinge portion).

Since the related art display had a non-foldable structure, a structure in which a display is disposed over foldably connected two bodies could not be implemented. Therefore, a large screen could not actually be applied to an electronic device with a folding structure.

However, as a bendable flexible display has been developed recently, researches to apply a flexible display to a mobile terminal are being conducted, and thus, it is possible to implement a large screen on a device.

Such a flexible display device may realize various sizes of screens by using deformable characteristics of the flexible display. For example, a flexible display device that can be extended to a screen size desired by a user by allowing the flexible display to be drawn out of the device body to extend an area exposed outside may be considered.

However, in the case of such a flexible display device, in order to take advantage of the deformable characteristics of the flexible display, many components should be installed therein, and thus the structure thereof may be complicated. In this case, since a large number of components should be installed in the internal space, utilizing the space is limited, and thus, securing sufficient battery installation space may be difficult. Also, unnecessary load is applied to the flexible display as the flexible display is deformed, and this may result in degrading durability of the device.

In addition, in the flexible display in which two bodies move away from or move closer to each other in one direction to extend or reduce a size of the display, the two bodies moved away from each other may rotate in a direction in which they deviate from each other, thereby degrading the durability or damaging the device.

Therefore, it is necessary to propose a mechanism of a flexible display device in which a screen may be exposed to a front surface and a rear surface of a frame, respectively, and consider a method in which two frames (bodies) do not deviate from each other while providing smooth movement of the flexible display.

DETAILED DESCRIPTION OF THE DISCLOSURE

Technical Problem

A first aspect of the present disclosure is to provide a flexible display device having a new mechanism of a rolling type to implement various screens of a flexible display.

A second aspect of the present disclosure is to provide a structure of a flexible display device capable of implementing a smooth movement of a flexible display, being stably supported even in a deformation of the flexible display, and reducing a relative rotation in a mutually opposite direction of two bodies of the device.

Technical Solution

To achieve the above aspect and other advantages of the present disclosure, there is provided a flexible display device including: a first body; a second body configured to be relatively movable with respect to the first body; a flexible display disposed on a front surface of the first body and a rear surface of the second body, respectively, and configured to vary in size of areas that are exposed to the front surface of the first body and to the rear surface of the second body as the first body and the second body are relatively moved; and a rotating bending bar disposed in at least one of the first body and the second body, and rotated while the first body and the second body are moved to couple the first body and the second body.

As another example, at least a part of the rotating bending bar may be inserted into a body other than a body at which the rotating bending bar is disposed to reduce a relative rotation of the first body and the second body at a position where the first body and the second body are disposed farthest from each other.

As another example, the flexible display may be capable of implementing: a first state in which the first body and the second body are located adjacent to each other and have a largest area exposed to the rear surface of the second body; a second state in which the first body and the second body move away from each other and have a largest area exposed to the front surface of the first body; and a stroke state in which the first state and the second state are interchanged with each other.

As another example, the flexible display device may further include: a first frame coupled to the first body and moved with the first body; and a second frame coupled to the second body and moved with the second body, wherein the rotating bending bar is disposed in the first frame and is rotated in the stroke state so that at least a part of the rotating bending bar is inserted into the second frame.

As another example, the rotating bending bar may include: a rotation shaft that is a rotation center of the rotating bending bar; a locking protrusion protruding from the rotation shaft toward the second frame; and a locking hook protruding from the rotation shaft and bent to extend in a direction away from the second frame.

As another example, a first groove into which the rotation shaft is inserted may be formed in the first frame, and the rotating bending bar may be rotated while being inserted into the first groove.

As another example, the rotation shaft may be disposed in the first groove, and a second groove may be formed in the first frame to provide a space in which the locking hook is rotated.

As another example, a direction in which the relative rotation of the first body and the second body is reduced by the rotating bending bar may be a direction forming an angle with a direction in which the first body and the second body are moved in a process in which the first state and the second state are interchanged with each other.

As another example, respective surfaces of the first frame and the second frame facing each other may be disposed adjacent to each other, and move in a state being parallel to each other when the first frame and the second frame are changed between the first state and the second state.

As another example, the locking protrusion may protrude from the rotation shaft toward the second frame more than a height of the surface of the first frame, and a recessed portion recessed inward from the surface of the second frame corresponding to a protruded height of the locking protrusion may be formed at the second frame.

As another example, the second frame may include a protrusion that is locked to the locking protrusion when the first body and the second body are changed between the first state and the second state, and the rotating bending bar may be rotated as the locking protrusion is locked to the protrusion.

As another example, the protrusion may be disposed at a rear end of the recessed portion.

As another example, an end portion of the locking hook may be rotated from the first frame toward the second frame as the rotating bending bar rotates, and an insertion hole into which the rotated locking hook is inserted may be formed at the second frame.

As another example, at least a part of a body plate of the second frame may be inserted into a lower portion of a bent end portion of the rotated locking hook, as the first body and the second body are changed to the second state.

As another example, the insertion hole may be disposed at an end portion of the protrusion to allow the locking hook to be inserted thereinto when the first body and the second body are changed from the first state to the second state.

As another example, the insertion hole may be provided in plural, and each of the insertion holes may be spaced apart from each other in a direction in which the first body and the second body are moving when changed from the first state to the second state, and the protrusion may be disposed between the spaced insertion holes.

As another example, the rotating bending bar may be disposed in an overlapping area in which the first body and the second body overlap each other in the second state.

Advantageous Effects

The effects of the present disclosure to be obtained by the above-described solutions are as follows.

First, as the first body and the second body are coupled by the rotating bending bar, a deviated rotation when the first body and the second body are changed from the first state to the second state in a direction forming an angle with the first direction in which the second body is moved may be reduced.

That is, the rotating bending bar may couple the first frame and the second frame to each other to prevent the first body and the second body from being relatively moved in the above-described direction. That is, a moment generated around the rotating bending bar may be absorbed by the rotating bending bar. With such a configuration, structural rigidity and stability of the first body and the second body supporting the flexible display are increased.

Second, the protrusion is disposed on an upper end of the locking protrusion of the rotated rotating bending bar so as to prevent reverse rotation of the locking protrusion of the rotated rotating bending bar, thereby preventing a problem in which the rotating bending bar rotated by the protrusion is reversely rotated to obstruct the locking hook from being inserted into the insertion hole.

Figure 2:
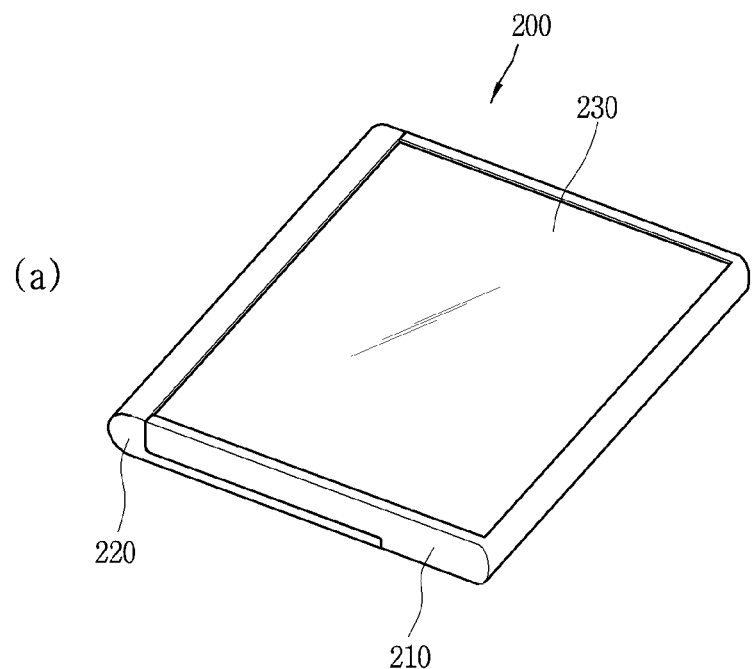
Figure 2:
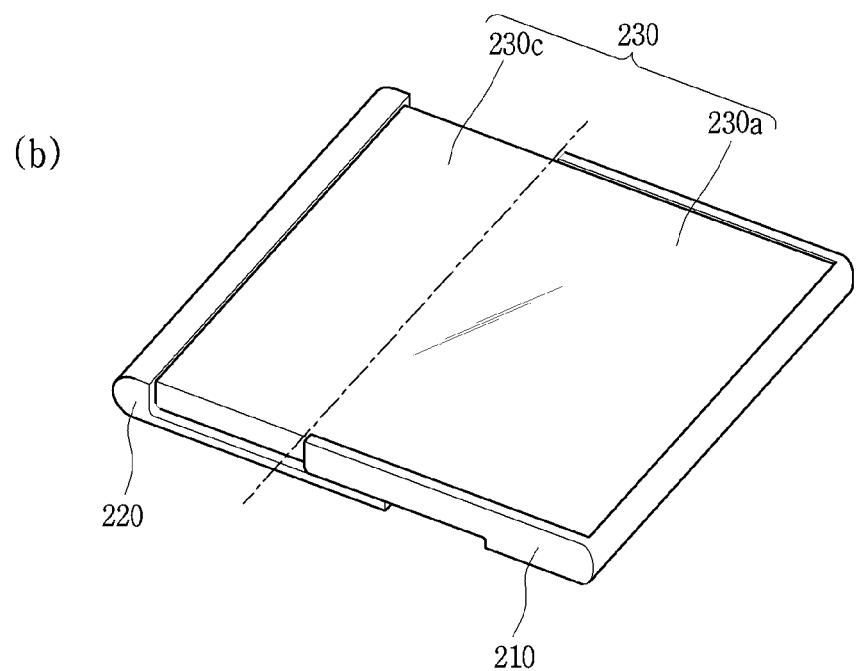

(a) of FIG. 2 is a perspective view illustrating an exterior appearance of a front surface of a flexible display device in a first state.

(b) of FIG. 2 is a perspective view illustrating an exterior appearance of a front surface of a flexible display device in a second state.

Figure 3:
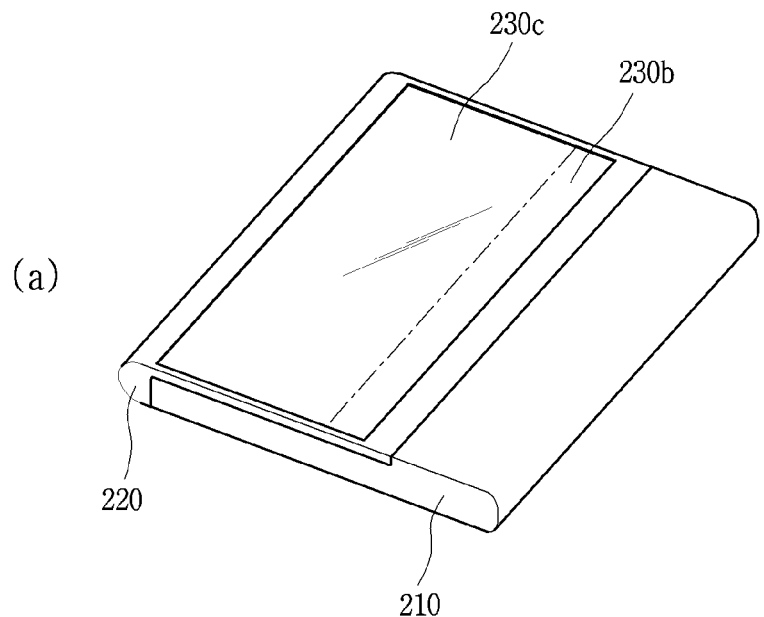
Figure 3:
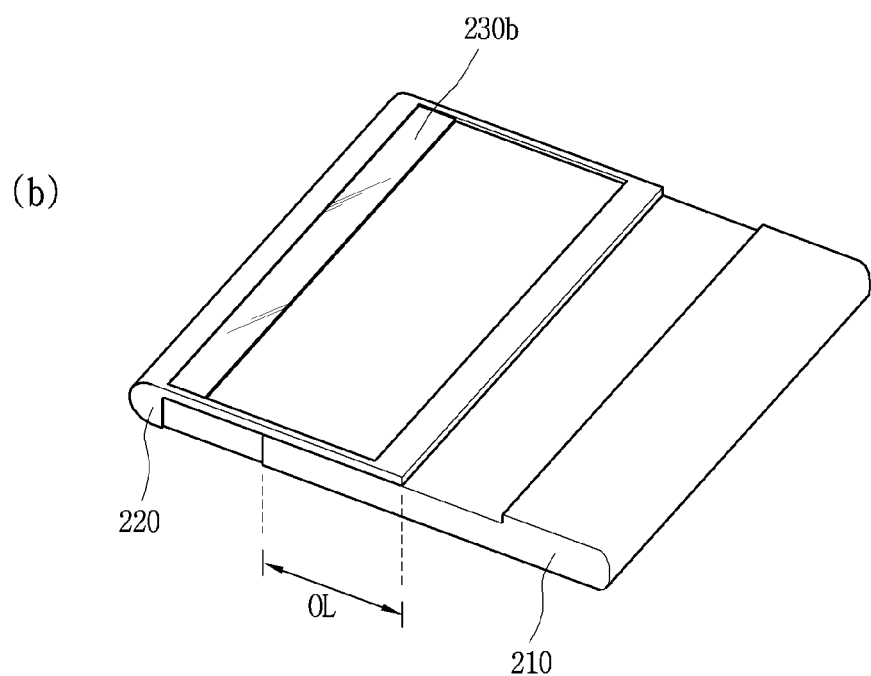

(a) of FIG. 3 is a perspective view illustrating an exterior appearance of a rear surface of a flexible display device in a first state.

(b) of FIG. 3 is a perspective view illustrating an exterior appearance of a rear surface of a flexible display device in a second state.

Figure 4A:
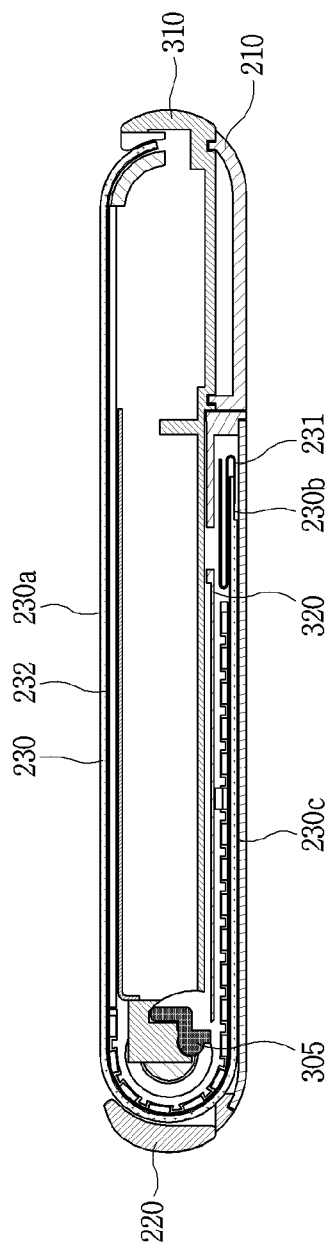

FIG. 4A is a cross-sectional view of a flexible display device in a first state.

Figure 4B:
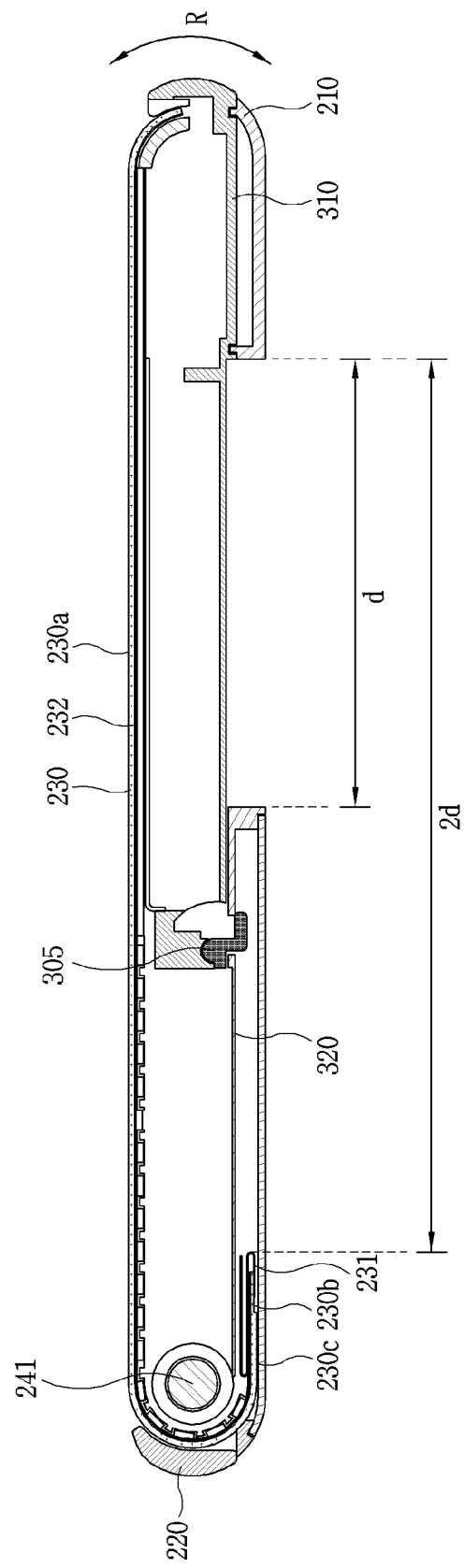

FIG. 4B is a cross-sectional view of a flexible display device in a second state.

Figure 5:
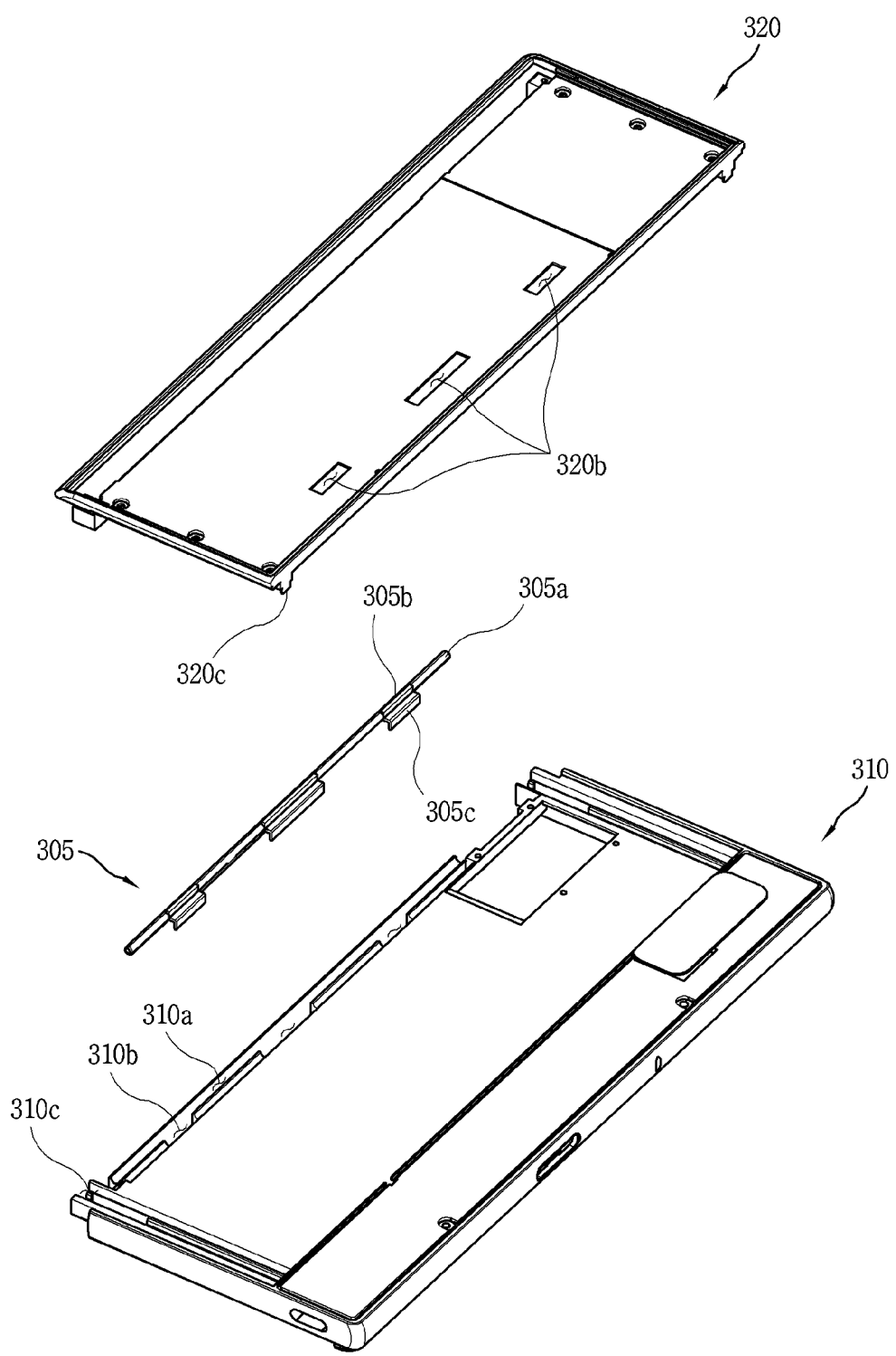

FIG. 5 is an exploded perspective view illustrating a first frame, a second frame, and a rotating bending bar.

Figure 6:
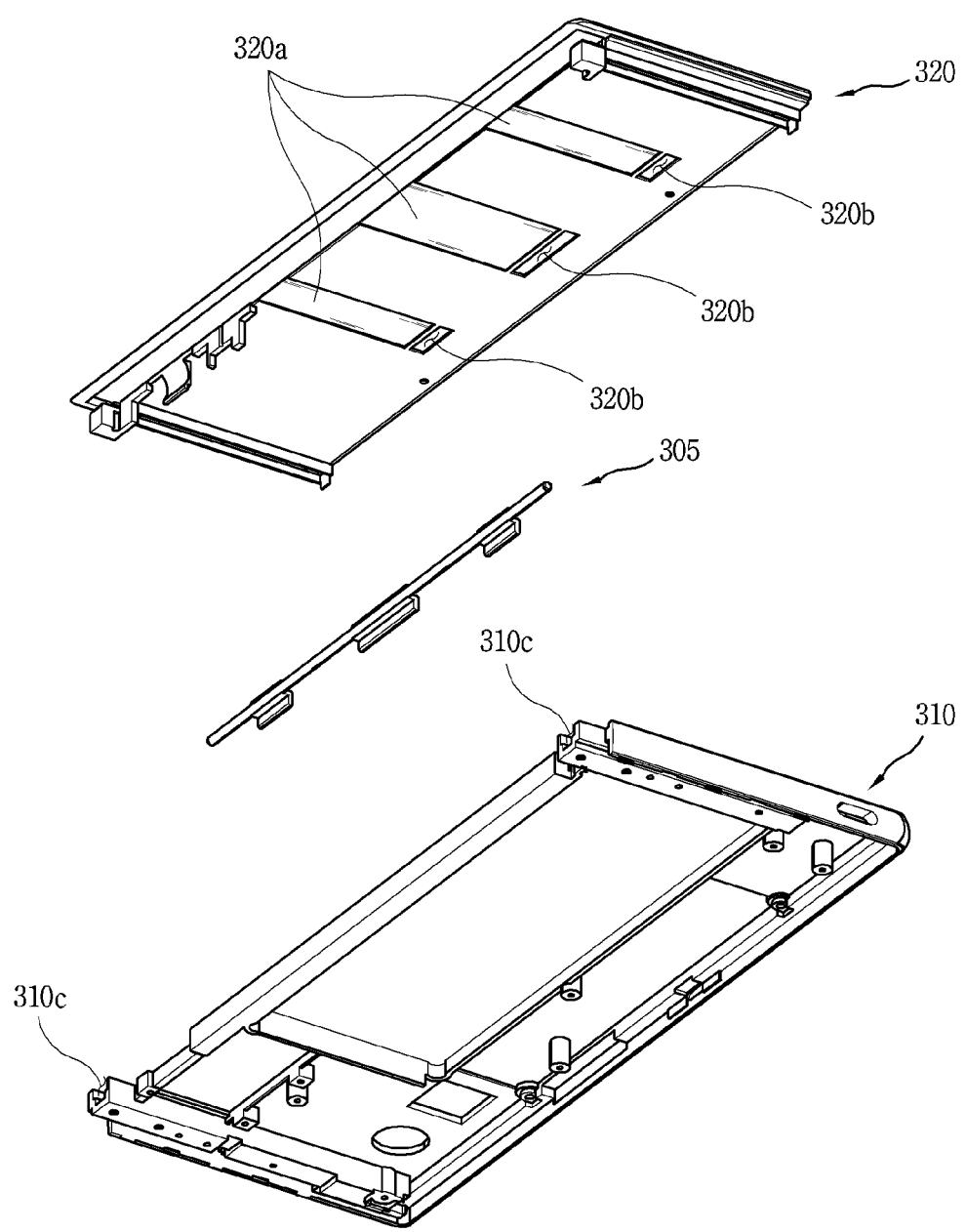

FIG. 6 is an exploded perspective view of the first frame, the second frame, and the rotating bending bar illustrated in FIG. 5, viewed from different directions.

Figure 7:
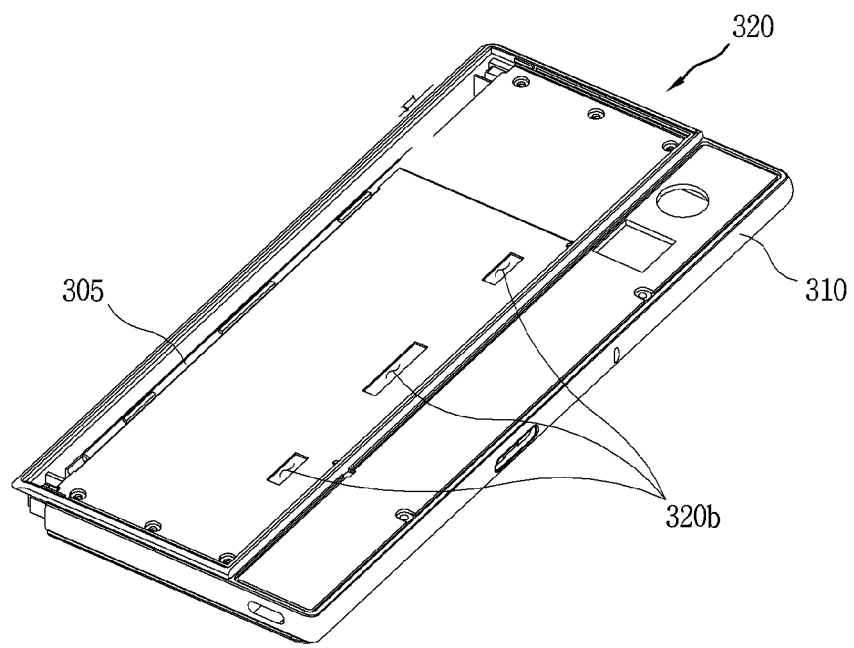
Figure 7:
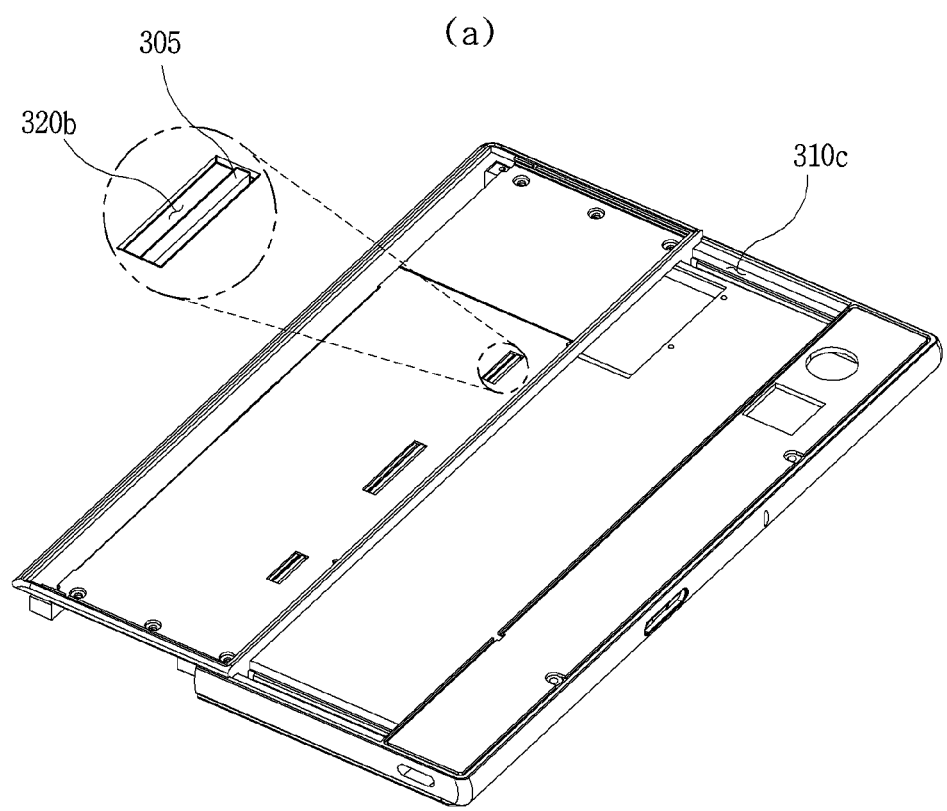

(a) of FIG. 7 is a perspective view illustrating a state in which the first frame, the second frame, and the rotating bending bar illustrated in FIG. 5 are coupled in the first state.

(b) of FIG. 7 is a perspective view illustrating a state in which the first frame, the second frame, and the rotating bending bar illustrated in FIG. 5 are coupled in the second state.

Figure 8:
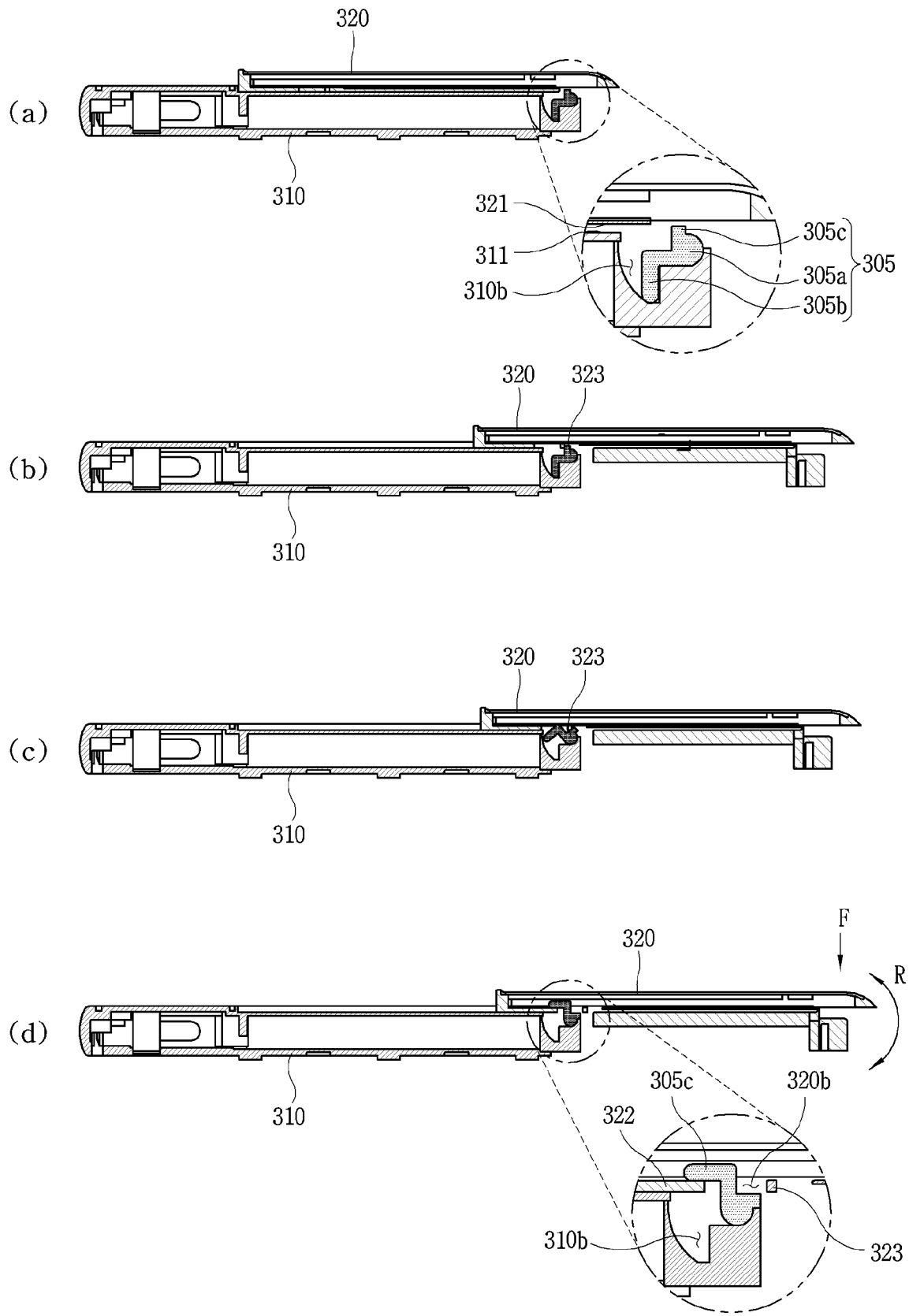

FIG. 8 is a cross-sectional view illustrating a state in which a first frame, a second frame, and a rotating bending bar are changed from a first state to a second state.

Figure 9:
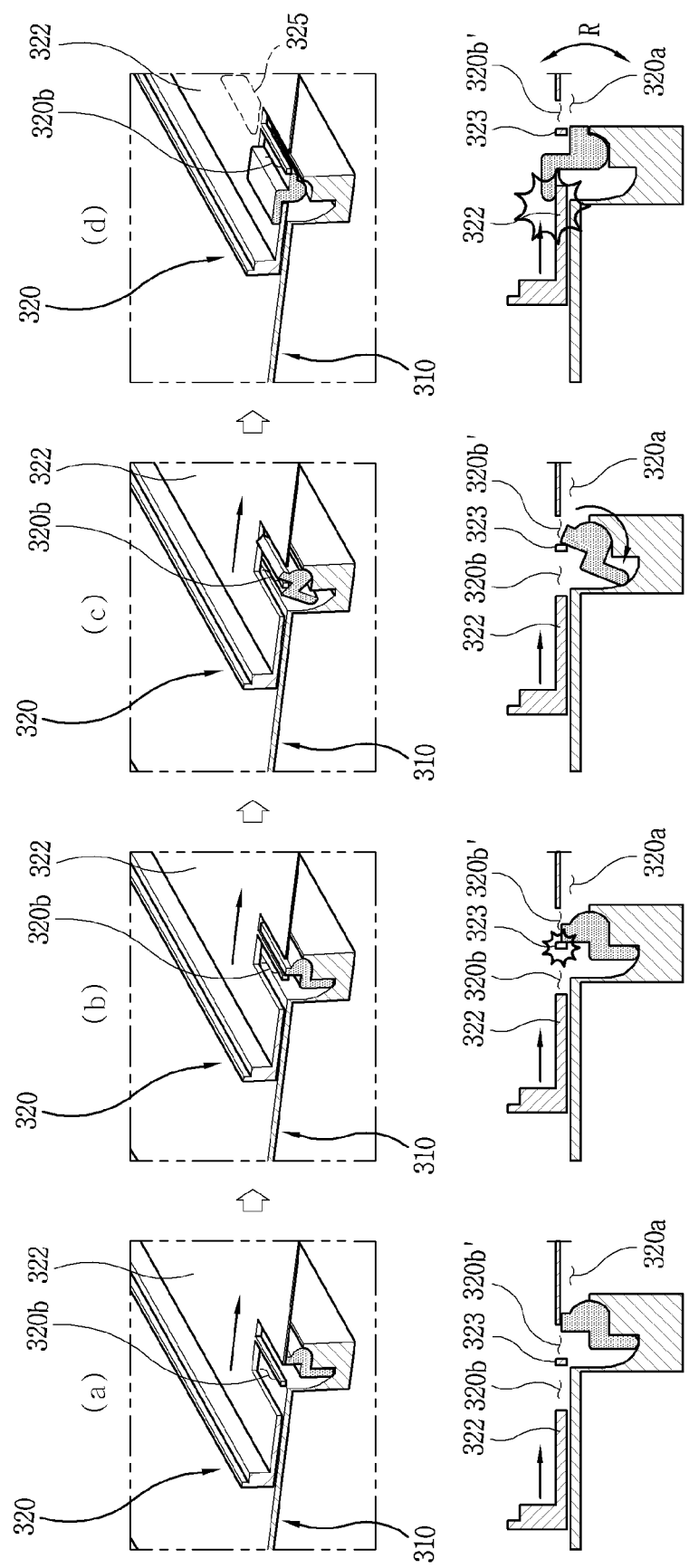
Figure 10:
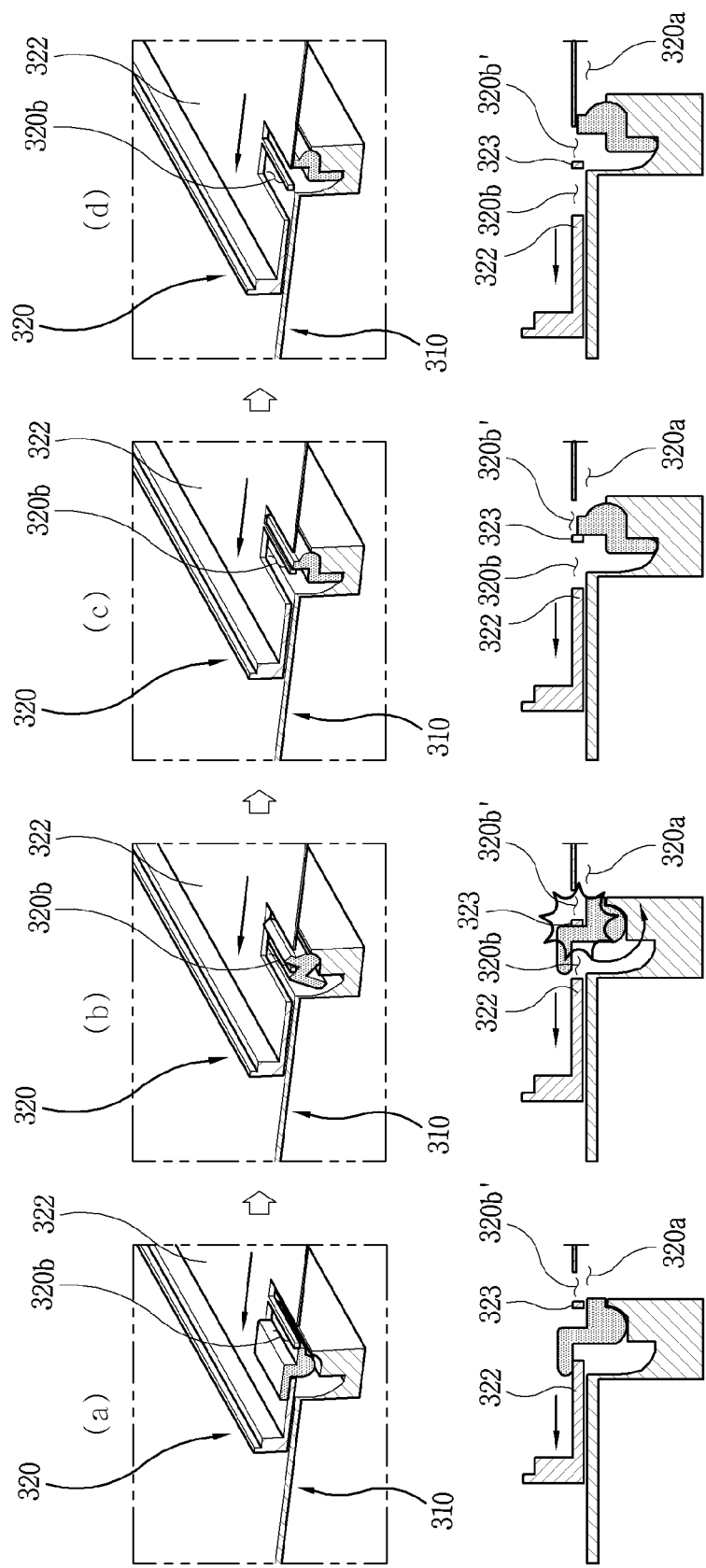

FIGS. 9 and 10 are conceptual views illustrating a state in which the first frame, the second frame, and the rotating bending bar of FIG. 8 are changed between the first state and the second state.

MODES FOR CARRYING OUT PREFERRED EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Display devices presented herein may be implemented using a variety of different types of terminals. Examples of such devices include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like. Hereinafter, for convenience of description, the mobile terminal will be described as one example of the flexible display device.

Figure 1:
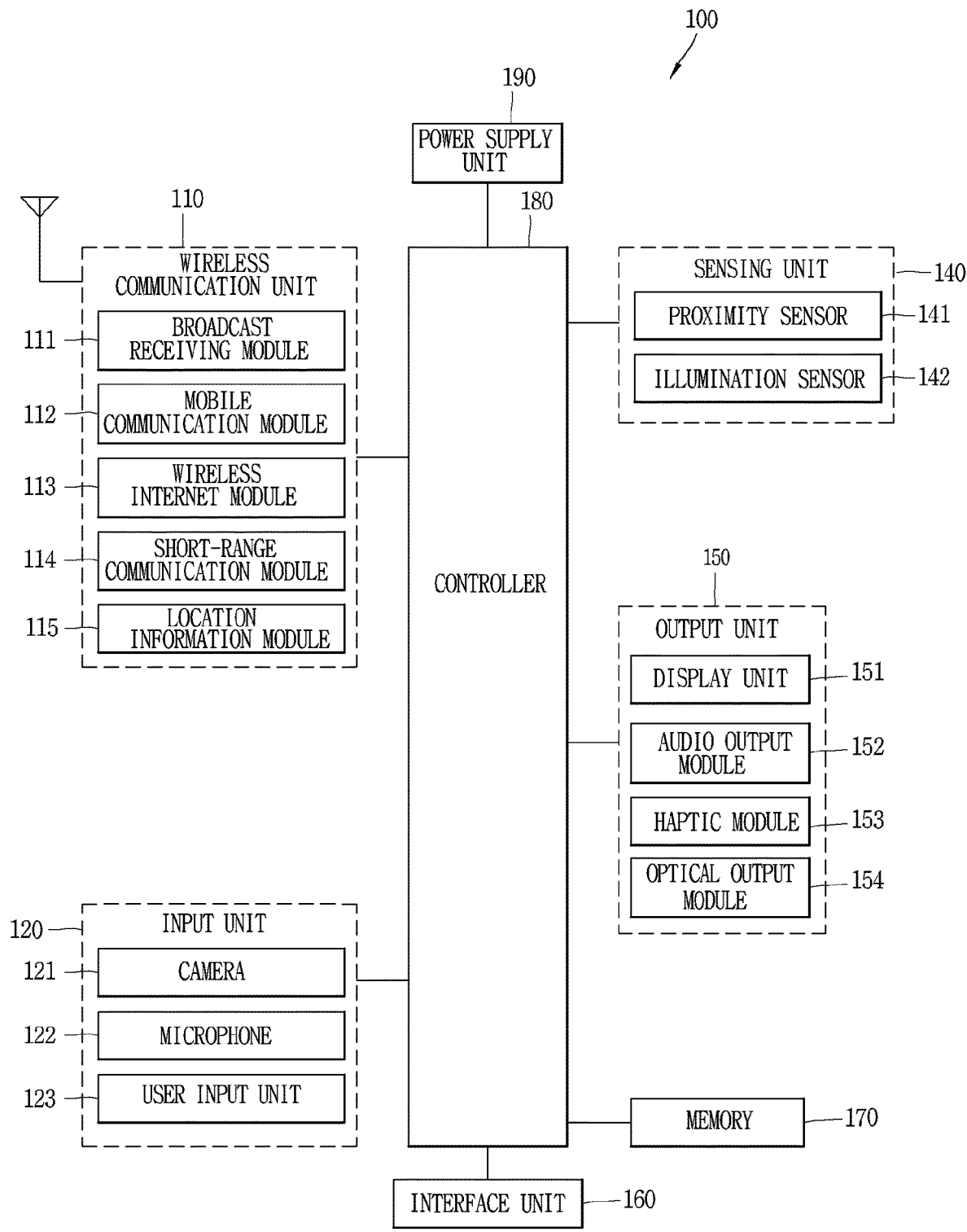
FIG. 1 is a block diagram of a mobile terminal in accordance with the present disclosure.

FIG. 1 is a block diagram of a mobile terminal in accordance with the present disclosure.

The mobile terminal 100 may include a wireless communication unit 110, an input unit 120, a sensing unit 140, an output unit 150, an interface unit 160, a memory 170, a controller 180, a power supply unit 190, etc. It is understood that implementing all of the illustrated components is not a requirement. Greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiver 111, a mobile communication module 112, a wireless Internet module 113, a short-range communication module 114, and a location information module 115.

First, regarding the wireless communication unit 110, the broadcast receiver 111 is configured to receive a broadcast signal and/or broadcast associated information from an external broadcast managing server via a broadcast channel. The broadcast channel may include a satellite channel, a terrestrial channel, or both. In some embodiments, two or more broadcast receivers may be utilized to facilitate simultaneous reception of two or more broadcast channels, or to support switching among broadcast channels.

The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal in a form that a TV or radio broadcast signal is combined with a data broadcast signal.

The broadcast signal may be encrypted by at least one of technical standards (or broadcasting methods, e.g., ISO, IEC, DVB, ATSC, etc.) for transmitting and receiving a digital broadcast signal. The broadcast receiving module 111 may receive the digital broadcast signal using a method suitable for a technical standard selected from those technical standards.

Examples of the broadcast associated information may include information associated with a broadcast channel, a broadcast program, a broadcast service provider, and the like. The broadcast associated information may be provided via a mobile communication network. In this case, the broadcast associated information may be received by the mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like. The broadcast signal and/or the broadcast related information received through the broadcast receiving module 111 may be stored in the memory 160.

The mobile communication module 112 can transmit and/or receive radio signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

The radio signal may include various types of data depending on a voice call signal, a video call signal, or a text/multimedia message transmission/reception.

The wireless Internet module 113 refers to a module for wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), High Speed Uplink Packet Access (HSUPA), Long Term Evolution (LTE), LTE-advanced (LTE-A) and the like. The wireless Internet module 113 may transmit/receive data according to one or more of such wireless Internet technologies, and other Internet technologies as well.

When the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area network.

Here, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position (or current position) of the mobile terminal. As an example, the location information module 115 includes a Global Position System (GPS) module, a Wi-Fi module, or both. For example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module. If desired, the location information module 115 may alternatively or additionally function with any of the other modules of the wireless communication unit 110 to obtain data related to the position of the mobile terminal. The location information module 115 is a module used for acquiring the position (or the current position) and may not be limited to a module for directly calculating or acquiring the position of the mobile terminal.

Next, the input unit 120 is for inputting image information (or signal), audio information (or signal), data, or information input from a user. For inputting image information, the mobile terminal 100 may be provided with a plurality of cameras 121.

Such cameras 121 may process image frames of still pictures or video obtained by image sensors in a video or image capture mode. The processed image frames can be displayed on the display 151 or stored in memory 170. Meanwhile, the cameras 121 may be arranged in a matrix configuration to permit a plurality of images having various angles or focal points to be input to the mobile terminal 100. Also, the cameras 121 may be located in a stereoscopic arrangement to acquire left and right images for implementing a stereoscopic image.

The microphone 122 processes an external audio signal into electric audio (sound) data. The processed audio data can be processed in various manners according to a function executed in the mobile terminal 100. The microphone 122 may include assorted noise removing algorithms to remove unwanted noise generated in the course of receiving the external audio signal.

The user input unit 123 is a component that receives an input of information from a user. Such user input may enable the controller 180 to control operation of the mobile terminal 100 in correspondence with the received information. The user input unit 123 may include one or more of a mechanical input element (for example, a mechanical key, a button located on a front and/or rear surface or a side surface of the mobile terminal 100, a dome switch, a jog wheel, a jog switch, and the like), or a touch-sensitive input element, among others. As one example, the touch-sensitive input element may be a virtual key, a soft key or a visual key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like, and generate a corresponding sensing signal. The controller 180 generally cooperates with the sending unit 140 to control operations of the mobile terminal 100 or execute data processing, a function or an operation associated with an application program installed in the mobile terminal based on the sensing signal. The sensing unit 140 may be implemented using any of a variety of sensors, some of which will now be described in more detail.

The proximity sensor 141 refers to a sensor to sense presence or absence of an object approaching a surface, or an object existing near a surface, by using an electromagnetic field, infrared rays, or the like without a mechanical contact. The proximity sensor 141 may be arranged at an inner area of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data (or information) according to whether a touch with respect to a point on the touch screen is either a proximity touch or a contact touch.

A touch sensor senses a touch (or a touch input) applied to the touch screen (or the display 151) using any of a variety of touch methods. Examples of such touch methods include a resistive type, a capacitive type, an infrared type, and a magnetic field type, among others.

As one example, the touch sensor may be configured to convert changes of pressure applied to a specific part of the display 151, or convert capacitance occurring at a specific part of the display 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which area of the display 151 has been touched. Here, the touch controller may be a component separate from the controller 180, the controller 180, and combinations thereof.

Meanwhile, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches include a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize location information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121, which has been depicted as a component of the input unit 120, includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors (TRs) at rows and columns to scan content received at the photo sensor using an electrical signal which changes according to the quantity of applied light. Namely, the photo sensor may calculate the coordinates of the physical object according to variation of light to thus obtain location information of the physical object.

The display 151 is generally configured to output information processed in the mobile terminal 100. For example, the display 151 may display execution screen information of an application program executing at the mobile terminal 100 or user interface (UI) and graphic user interface (GUI) information in response to the execution screen information.

Also, the display 151 may be implemented as a stereoscopic display for displaying stereoscopic images.

A typical stereoscopic display may employ a stereoscopic display scheme such as a stereoscopic scheme (a glass scheme), an auto-stereoscopic scheme (glassless scheme), a protrusion scheme (holographic scheme), or the like.

The audio output module 152 may receive audio data from the wireless communication unit 110 or output audio data stored in the memory 170 during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceives, or otherwise experiences. A typical example of a tactile effect generated by the haptic module 153 is vibration. The strength, pattern and the like of the vibration generated by the haptic module 153 may be controlled by user selection or setting by the controller 180. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal therethrough. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a flash memory type, a hard disk type, a solid state disk (SSD) type, a silicon disk drive (SDD) type, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control operations relating to application programs and the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provides internal power and supply the appropriate power required for operating respective elements and components included in the wearable device 100 under the control of the controller 180. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

The display 151 is generally configured to output information processed in the mobile terminal 100. For example, the display 151 may display execution screen information of an application program executing at the mobile terminal 100 or user interface (UI) and graphic user interface (GUI) information in response to the execution screen information.

The display 151 may include at least one of a liquid crystal display (LCD), a thin film transistor-LCD (TFT LCD), an organic light-emitting diode (OLED), a flexible display, a three-dimensional (3D) display and an e-ink display.

The display 151 may be implemented using two display devices, according to the configuration type thereof. For instance, a plurality of the displays 151 may be arranged on one side, either spaced apart from each other, or these devices may be integrated, or these devices may be arranged on different surfaces.

The display 151 may include a touch sensor that senses a touch with respect to the display 151 so as to receive a control command in a touch manner. Accordingly, when a touch is applied to the display 151, the touch sensor may sense the touch, and a controller 180 may generate a control command corresponding to the touch. Contents input in the touch manner may be characters, numbers, instructions in various modes, or a menu item that can be specified.

The microphone 122 may be configured to receive the user's voice, other sounds, and the like. The microphone 122 may be provided at a plurality of places, and configured to receive stereo sounds.

The interface unit 160 may serve as a path allowing the mobile terminal 100 to interface with external devices. For example, the interface unit 160 may be at least one of a connection terminal for connecting to another device (for example, an earphone, an external speaker, or the like), a port for near field communication (for example, an Infrared DaAssociation (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

At least one antenna for wireless communication may be disposed on the terminal body. The antenna may be embedded in the terminal body or formed in the case. For example, an antenna which configures a part of the broadcast receiver 111 (see FIG. 1A) may be retractable into the terminal body. Alternatively, an antenna may be formed in a form of film to be attached onto an inner surface of the housing or a case including a conductive material may serve as an antenna.

The terminal body is provided with a power supply unit 190 (see FIG. 1A) for supplying power to the mobile terminal 100. The power supply unit 190 may include a batter 191 which is mounted in the terminal body or detachably coupled to an outside of the terminal body.

The battery 191 may receive power via a power cable connected to the interface unit 160. Also, the battery 191 may be (re)chargeable in a wireless manner using a wireless charger. The wireless charging may be implemented by magnetic induction or electromagnetic resonance.

An accessory for protecting an appearance or assisting or extending the functions of the mobile terminal 100 may further be provided on the mobile terminal 100. As one example of the accessory, a cover or pouch for covering or accommodating at least one surface of the mobile terminal 100 may be provided. The cover or pouch may cooperate with the display 151 to extend the function of the mobile terminal 100. Another example of the accessory may be a touch pen for assisting or extending a touch input onto a touch screen.

(a) of FIG. 2 is a perspective view illustrating an exterior appearance of a front surface of the flexible display device in a first state, and (b) of FIG. 2 is a perspective view illustrating an exterior appearance of the front surface of the flexible display device in a second state. (a) of FIG. 3 is a perspective view illustrating an appearance of a rear surface of the flexible display device in the first state, and (b) of FIG. 3 is a perspective view illustrating an appearance of the rear surface of the flexible display device in the second state.

The flexible display device is a device capable of varying in size of a screen due to a deformation of the flexible display, which may be understood as one of the above-described mobile terminals. In the present disclosure, the device will be referred to as a flexible display device.

The flexible display device 200 according to the present disclosure is configured to have a shape in which a flexible display 230 is exposed to an outside of a first body 210 and a second body 220.

Specifically, as illustrated in FIGS. 2 and 3, the flexible display device 200 may provide a screen to a user in various ways by exposing the flexible display 230 to a front surface and a rear surface of the flexible display device 200.

In addition, the size of the screen exposed to the front surface and to the rear surface of the flexible display device 200 may vary according to a mutual movement of the first body 210 and the second body 220.

As illustrated in (a) of FIG. 2 and (a) of FIG. 3, the flexible display device 200 may implement the first state in which the first body 210 and the second body 220 are positioned to be close to each other, thereby decreasing an area of the flexible display 230 exposed to the front surface of the flexible display device 200.

In the first state, as illustrated in (a) of FIG. 3, the area of the flexible display 230 exposed to the rear surface of the flexible display device 200 is increased.

In addition, as illustrated in (b) of FIG. 2 and (b) of FIG. 3, the flexible display device 200 may implement the second state in which the first body 210 and the second body 220 are positioned to be far from each other, thereby increasing the area of the flexible display 230 exposed to the front surface of the flexible display device 200.

In the second state, as illustrated in (b) of FIG. 2, the area of the flexible display 230 exposed to the front surface of the flexible display device 200 increases, and correspondingly, as illustrated in (b) of FIG. 3, the area of the flexible display 230 exposed to the rear surface of the flexible display device 200 decreases.

The flexible display device 200 may change between the first state and the second state, according to the mutual movement of the first body 210 and the second body 220.

Specifically, the first state is described as follows. The area of the flexible display 230 exposed to the front surface may be minimum. The area of the flexible display 230 exposed to the rear surface may be maximum. A distance between the first body 210 and the second body 220 may be minimum.

The second state is described as follows. The area of the flexible display 230 exposed to the front surface may be maximum. The area of the flexible display 230 exposed to the rear surface may be minimum. The distance between the first body 210 and the second body 220 may be maximum.

In addition, a state in which the device changes from the first state to the second state, or vice versa, may be referred to as a stroke state. That is, the stroke state may refer to a state that is changed from the first state to the second state or changed from the second state to the first state.

When a direction in which the second body 220 is moved away from the first body 210 is referred to as a first direction, the area of the flexible display 230 exposed to the front surface of the flexible display device 200 may be increased along the first direction as the flexible display device 200 moves in the first direction.

At this time, by the movement in the first direction of the flexible display device 200, the area of the flexible display 230 exposed to the rear surface is reduced along the first direction.

In addition, when the second body 220 is moved closer to the first body 210 in a second direction, which is an opposite direction to the first direction, the area of the flexible display 230 exposed to the front surface of the flexible display device 200 may be decreased along the second direction as the flexible display device 200 moves in the second direction. In this case, the area of the flexible display 230 exposed to the rear surface of the flexible display device 200 may be increased along the second direction, as the flexible display device 200 moves in the second direction.

The flexible display device 200 according to the present disclosure may include the flexible display 230 that may be deformed by an external force.

The deformation may be at least one of curving, bending, folding, twisting, and rolling of a display module. A deformable display module may be referred to as 'flexible display'. Here, the flexible display 230 may include a typical flexible display, electronic paper (e-paper), and a combination thereof.

The typical flexible display refers to a durable display that is lightweight and does not break easily by being fabricated on a thin, flexible substrate, such as paper, which is bent, curved, folded, twisted or rolled while maintaining characteristics of an existing flat panel display.

In addition, the electronic paper is a display to which general ink characteristics are applied, and is different from the existing flat panel display in view of using reflected light. The electronic paper may change information by using a twist ball or electrophoresis using a capsule.

In the flexible display device 200 according to the present disclosure, one side of the flexible display 230 is configured to be deformed by an external force (for example, configured to have a finite curvature radius (see a roller 241 of FIG. 4B)), and a position of the deformed one side of the flexible display 230 is changed according to the mutual movement of the first body 210 and the second body 220.

That is, the flexible display device 200 may realize the first state and the second state as a position of the flexible display 230 deformed along an outer surface of the roller 241 to be described later is changed.

The flexible display 230 may output visual information through an exposed screen in the first state and the second state. Such visual information is realized by independently controlling an emission of unit pixels (sub-pixels) arranged in a matrix form. The unit pixel denotes an elementary unit for representing one color.

The flexible display 230 may be in a curved state (for example, a state having a predetermined curvature along the outer surface of the roller 241) rather than in a flat state in which one side of the flexible display 230 is flat in the first state and the second state, respectively.

When an external force is applied to the flexible display 230, the flexible display 230 may be deformed into the flat state (or a less curved state) or a more curved state.

Meanwhile, the flexible display 230 may be combined with a touch sensor to implement a flexible touch screen (not shown). When a touch is applied to the flexible touch screen (not shown), the controller 180 (see FIG. 1) may perform a control corresponding to the touch input. The flexible touch screen may be configured to detect a touch input in the stroke state as well as the first state and the second state.

Meanwhile, the flexible display device 200 according to this varied example may be provided with a deformation detecting unit to detect a deformation of the flexible display 230. The deformation detecting unit may be included in the sensing unit 140 (see FIG. 1).

The deformation detecting unit may be provided on one side of the flexible display 230 or on the bodies 210 and 220 to detect information related to the deformation of the flexible display 230. Here, the information related to the deformation may be a direction in which the flexible display 230 is deformed, a deformed degree, a deformed position, a deformed time, and an acceleration at which the deformed flexible display 230 is restored. In addition, the information may be various which is detectable as the flexible display 230 is curved.

Here, the controller 180 (see FIG. 1) may change information displayed on the flexible display 230 or generate a control signal to control functions of the flexible display device 200 based on the information related to the deformation of the flexible display 230 detected by the deformation detecting unit.

The state of the flexible display 230 is not always be changed by an external force. For example, when the flexible display 230 may be changed from the first state to the second state by a user or by a command of an application, and may be changed from the second state to the first state in the same manner.

The flexible display device 200 according to an embodiment of the present disclosure may include a case (e.g., a frame or a cover) defining an exterior appearance. The case may include the first body 210 and the second body 220, and various electronic components may be disposed in the first body 210 and the second body 220.

The first body 210 and the second body 220 may define the exterior appearance of the flexible display 230, and the second body 220 may slide along the first body 210 to make relative movement and form the first state and the second state, respectively.

The flexible display 230 may be coupled to one surface of each of the first and second bodies 210 and 220 that are connected to each other so as to be movable relative to each other, and configured to deform according to the movement of the first body 210 and the second body 220.

The flexible display 230 may include a first area 230a, a second area 230b, and a third area 230c.

The first area 230a is coupled to be fixed to the front surface of the first body 210. The third area 230c neighboring in the first direction in the first area 230a may partially cover the front surface of the second body 220 and partially cover the rear surface of the second body 220, respectively.

The second area 230b is located between the first area 230a and the third area 230c and is fixed to a supporting plate 231 sliding in the first direction with respect to the second body 220.

That is, the flexible display 230 may include the first area 230a fixed to the first body 210, the second area 230b fixed to the supporting plate 231, and the third area 230c located between the first area 230a and the second area 230b and disposed on the front surface or the rear surface according to a state of the flexible display device 200.

Here, a curvature of the first area 230a and the second area 230b does not change and maintains a flat state, which is a basic state, but the third area 230c may be curved at another side of the second body 220 and bent toward the rear surface.

When the flexible display device 200 changes from the first state to the second state, the third area 230c positioned adjacent to the first area 230a becomes wider, and at this time, a position of the third area 230c being deformed depends on a position where the second body 220 is sliding.

That is, a portion of the flexible display 230 being deformed varies according to the state of the flexible display device 200. Accordingly, an external force is not continuously applied to a specific portion of the flexible display 230. Thus, it is possible to reduce an accumulation of fatigue at any particular portion, and to prevent the flexible display 230 from being easily damaged.

The first area 230a of the flexible display 230 may be coupled to the front surface of the first body 210. Since the rear surface of the first body 210 is always exposed to the outside, a camera, a flash, a proximity sensor, or the like may be disposed on the rear surface.

A side surface (not shown) is provided around the first body 210, and defines an exterior of the flexible display device 200 except for an end portion in the first direction in which the second body 220 is inserted or drawn out. In addition, the interface unit to connect a power port or an ear jack or the user input unit such as a volume button may be disposed on the side surface. The side surface may serve as an antenna when it includes a metal material.

The rear surface of the second body 220 may be configured to support a part of the third area 230*c* of the flexible display 230. The second body 220 is supported by the side surface of the first body 210, and when changed from the first state to the second state, the second body 220 may support the rear surface of the extended flexible display 230 and support the third area 230*c* of the flexible display 230.

The first body 210 and the second body 220 respectively support one area of the flexible display 230, and a plurality of electronic components to operate the flexible display device 200 and a battery to form a power source may be mounted in an inner space formed by the first body 210 and the second body 220.

Here, as illustrated in FIGS. 2 and 3, the flexible display device 200 is configured such that the second body 220 is relatively slidable with respect to the first body 210, thereby implementing the first state in which the first body 210 and the second body 220 are positioned to be closer to each other and are configured to widen an exposed area of the rear surface.

In addition, the flexible display device 200 may be changed to the second state in which the first body 210 and the second body 220 are located far from each other and an exposed area of the front surface is increased. Accordingly, the user can utilize a screen of various size more conveniently by using the respective areas 230*a*, 230*b*, and 230*c* of the flexible display 230, and thus can use the screen in performing various tasks such as an e-book and web surfing.

FIG. 4A is a cross-sectional view of the flexible display device in the first state, and FIG. 4B is a cross-sectional view of the flexible display device in the second state.

The flexible display device 200 may include the first body 210, the second body 220, the supporting plate 231, the flexible display 230, and a rotating bending bar 305.

The first body 210 and the second body 220 define the exterior appearance of the flexible display device, and may be changed between the first state and the second stated according to the mutual movement of the first body 210 and the second body 220.

The second body 220 may move closer to or away from the first body 210 while sliding with respect to the first body 210. Accordingly, as illustrated in FIG. 4A, the first state in which the second body 220 faces the first body and is in close contact with the first body may be provided, or as illustrated in FIG. 4B, the second state in which the first body 210 and the second body 220 are away from each other may be provided.

In addition, a side surface of the second body 220 may be made of an opaque material or a transparent material. In this case, a transparent window is provided on the side surface of the second body 220, so that images or characters output from the flexible display 230 may be exposed to the outside.

That is, the flexible display 230 may include the first area 230*a* fixed to the first body 210, the second area 230*b* fixed to the supporting plate 231, and the third area 230*c* located between the first area 230*a* and the second area 230*b* and disposed on the front surface or the rear surface according to the state of the flexible display device 200.

In this case, the third area 230*c* may be disposed on the front surface or the rear surface of the flexible display device 200 according to the first state and the second state with respect to the mutual movement of the first body 210 and the second body 220.

The supporting plate 231 is installed on the rear surface of the second body 220, and is a plate-shaped member that slides along the rear surface or the side surface of the second body 220. Since the supporting plate 231 is attached to the second area 230*b* of the flexible display 230, when the second body 220 is inserted into or drawn out from the first body 210, the supporting plate 231 may be moved relative to the second body 220 to correspond to the inserted or drawn out distance of the second body 220.

The flexible display device may further include a driving unit.

The driving unit serves to form a driving force so that the second body 220 slides with respect to the first body 210, and may be installed in an inner space formed by the first body 210 and the second body 220. The driving unit may be installed and fixed to an inner side the first body 210.

The driving unit allows the second body 220 to slide in the first direction with respect to the first body 210, and in this case, allows the supporting plate 231 to slide in the first direction with respect to the second body 220.

The driving unit may form a movement in a front-rear direction of the second body 220 through a rotational force by a motor (not shown), and may change respective exposed areas on the front surface and a rear surface of the flexible display 230 of the flexible display device according to the front-rear direction movement of the second body 220.

As the second body 220 slides in the first direction away from the first body 210 by the driving unit, the second state may be provided.

The driving unit may include a roller, a connecting rod, a rack, a motor, a gear, and the like, and may allow the second body 220 to slide with respect to the first body 210 by forming a movement of the rack through the rotational force generated by the motor and moving the roller 241 connected to the rack.

For example, in a case of changing from the first state of FIG. 4A to the second state of FIG. 4B by the driving unit, when the second body 220 moves by a first distance d, the flexible display 230 moves by a second distance 2*d* corresponding to twice the first distance. In this case, in order for an end portion of the flexible display 230 to move by the second distance 2*d*, the supporting plate 231 in the second body 220 may also move by the distance 2*d* same as the distance in which the end portion of the flexible display 230 is moved.

The driving unit may allow the flexible display device 200 to interchange between the first state and the second state in a manner of forming a movement of the second body 220.

In addition, the flexible display device 200 may further include a rear surface plate 232. When the first state and the second state are implemented by the movement of the first body 210 and the second body 220, the rear surface plate 232 coupled to the flexible display 230 may also be deformed.

The rear surface plate 232 may be coupled to the rear surface of the flexible display 230. The rear surface plate 232 supports the flexible display 230, and may be deformed to correspond to a deformed one side of the flexible display 230 as the flexible display device 200 implements the first and second states.

The rear surface plate 232 may be made of thin stainless steel (STS). Since the rear surface plate 232 may be deformed together with the flexible display 230, the first state in (a) of FIG. 2 and (a) of FIG. 3 and the second state in (b) of FIG. 2 and (b) of FIG. 3 may be implemented.

As the flexible display device 200 is deformed from the first state to the second state, one side of the flexible display 230 may be deformed to a state in which an angle is changed, which may be implemented by a deformation of the rear surface plate 232.

As described above, the flexible display 230 may be exposed to the front surface of the first body 210 and to the rear surface of the second body 220, respectively, and may change in size of the areas exposed to the front surface of the first body 210 and to the rear surface of the second body 220 as the first body 210 and the second body 220 are relatively moved.

The third area 230c of the flexible display 230 may be deformed to have a predetermined curvature at one side together with the rear surface plate 232, and one side of the third area 230c may be curved forming a curved surface together with the rear surface plate 232.

In addition, the flexible display 230 may be coupled to the rear surface plate 232 by an adhesive member (not shown).

The adhesive member (not shown) serves a role to couple the rear surface of the flexible display 230 to one surface of the rear surface plate 232, and may be made of a material having a flexible characteristic to prevent a gap from being formed between the rear surface plate 232 and the flexible display 230 while the rear surface plate 232 and the flexible display 230 are deformed.

In addition, the adhesive member (not shown) may prevent a stress that may occur between the rear surface plate 232 and the flexible display 230 to limit the flexible display 230 from being damaged by an external force.

The adhesive member (not shown) may be made of a resin (elastomer resin) having an elastic force by using a synthetic epoxy resin or the like. Accordingly, the adhesive member (not shown) couples the flexible display 230 and the rear plate with each other in a close contact manner to allow the flexible display to be smoothly deformed together with the rear plate when one side of the flexible display 230 is deformed.

The rotating bending bar 305 may be disposed in at least one of the first body 210 and the second body 220. Specifically, the rotating bending bar 305 may be disposed in any one of the first body 210 or the second body 220. In addition, the rotating bending bar 305 may be disposed on both the first body 210 and the second body 220.

As described above, the rotating bending bar 305 is rotated while the first body 210 and the second body 220 are interchanged between the first state and the second state. Accordingly, the rotating bending bar 305 may couple the first body 210 and the second body 220 to each other.

At this time, at least a part of the rotating bending bar 305 may be inserted into a body other than a body at which the rotating bending bar 305 is disposed, as described above. For example, as at least a part of the rotating bending bar 305 is inserted into a body other than a body at which the rotating bending bar 305 is disposed, in a state in which the first body 210 and the second body 220 are disposed farthest, that is, the second state, the relative rotation of the first body 210 and the second body 220 may be reduced.

In addition, the first body 210 and the second body 220 may include a first frame 310 and a second frame 320, respectively. The first frame 310 is coupled to the first body 210 and moved together with the first body 210. The second frame 320 is coupled to the second body 220 and moved together with the second body 220.

Specifically, referring to FIG. 4A, the rotating bending bar 305 may be coupled to the first frame 310 which is coupled to the first body 210. And, a locking hook 305c of the rotating bending bar 305 to be described later is disposed toward the first frame 310. Here, the rotating bending bar 305 may be disposed in an overlapping area (OL, see (b) of FIG. 3) in which the first body 210 and the second body 220 overlap each other in the second state.

In addition, referring to FIG. 4B, the rotating bending bar 305 is rotated in the second state to be coupled to the second frame 320 which is coupled to the second body 220. That is, the locking hook 305c of the rotating bending bar 305 disposed in the first frame 310 is inserted into the second frame 320 to couple the second frame 320 to the first frame 310. Accordingly, the first body 210 and the second body 220 may be coupled to the first frame 310 and the second frame 320, respectively.

As the first body 210 and the second body 220 are coupled by the rotating bending bar 305, a deviated rotation when the first body 210 and the second body 220 are changed from the first state to the second state in a direction forming an angle with the first direction in which the second body 220 is moved may be reduced. Specifically, a rotation of the first body 210 in the above-described rotation direction R may be reduced.

FIG. 5 is an exploded perspective view illustrating the first frame, the second frame, and the rotating bending bar. FIG. 6 is an exploded perspective view of the first frame, the second frame, and the rotating bending bar illustrated in FIG. 5, viewed from different directions. (a) of FIG. 7 is a perspective view illustrating a state in which the first frame, the second frame, and the rotating bending bar illustrated in FIG. 5 are coupled in the first state. (b) of FIG. 7 is a perspective view illustrating a state in which the first frame, the second frame, and the rotating bending bar illustrated in FIG. 5 are coupled in the second state.

The first frame 310, the second frame 320, and the rotating bending bar 305 may be coupled one another in a thickness direction of the flexible display device 200. In addition, the second frame 320 may be coupled to the first frame 310 and moved to change between the first state and the second state.

The first frame 310 may be coupled to the first body 210 to move together with the first body 210. The first frame 310 may configure at least a part of the first body 210. The first frame 310 may have a first groove 310a and a second groove 310b into which the rotating bending bar 305 to be described later is inserted.

The first frame 310 is coupled to the second frame 320 to form a guide groove 310c that is to guide the movement of the first frame 310 and the second frame 320 in the process of interchanging between the first state and the second state.

The second frame 320 may be coupled to the first frame 310 in a state where most area of the second frame 320 is overlapped with the first frame 310. This state may be referred to as the first state. And, the second state may be provided when the second frame moves in a direction in which the area overlapping the first frame 310 is decreased.

Referring to FIG. 6, a recessed portion 320a and an insertion hole 320b may be formed in the second frame 320. The recessed portion 320a is an area recessed inward from a surface 321 of the second frame such that the second frame 320 is not caught by a locking protrusion 305b protruding from a surface 311 of the first frame, which will be described later. The insertion hole 320*b* is an opening into which the locking hook 305*c* of the rotating bending bar 305 to be described later is inserted.

A guide protrusion 320*c* coupled to the guide groove 310*c* of the first frame 310 may be provided at upper and lower ends of the second frame 320. The guide protrusion 320*c* may be inserted into the guide groove 310*c* to guide the movement.

Specifically, referring to FIGS. 5 and 6, the guide groove 310*c* is formed in the first frame 310, and the guide protrusion 320*c* is formed in the second frame 320. And, referring to (a) and (b) of FIG. 7, the guide groove 310*c* of the first frame 310 and the guide protrusion 320*c* of the second frame 320 are coupled to each other to allow the movement between the first state and the second state.

The rotating bending bar 305 may include a rotation shaft 305*a*, the locking protrusion 305*b*, and the locking hook 305*c*.

The rotation shaft 305*a* constitutes a rotation center of the rotating bending bar. The rotation shaft 305*a* may be disposed in the first groove 310*a* of the first frame 310. The rotating bending bar 305 is rotated by the second frame 320 to be described later in a state of being inserted into the first groove 310*a*.

The locking protrusion 305*b* protrudes from the rotation shaft 305*a* in a direction toward the second frame 320. The locking protrusion 305*b* may protrude higher than the surface 311 of the first frame. Accordingly, the rotating bending bar 305 is rotated by being pressed by the second frame 320.

The locking hook 305*c* protrudes from the rotation shaft 305*a* and is curved and extended in a direction away from the second frame 320. The second groove 310*b* may be formed in the first frame 310 to provide a space in which the locking hook 305*c* is rotated.

Meanwhile, as illustrated in FIGS. 5 to 7, the locking protrusion 305*b* and the locking hook 305*c* of the rotating bending bar 305 may be provided in plural. The locking protrusions 305*b* and the locking hooks 305*c* may be spaced apart from each other along a lengthwise direction of the rotation shaft 305*a*. In this way, as the locking protrusions 305*b* and the locking hooks 305*c* are provided in plural, the rotating bending bar 305 may stably support the first body 210 and the second body 220 in an up-down direction.

FIG. 8 is a cross-sectional view illustrating a state in which the first frame, the second frame, and the rotating bending bar are changed from the first state to the second state. FIGS. 9 and 10 are conceptual views illustrating a state in which the first frame, the second frame, and the rotating bending bar of FIG. 8 are changed between the first state and the second state.

(a) of FIG. 8 is a cross-sectional view illustrating the first frame 310, the second frame 320, and the rotating bending bar 305 in the first state. (a) of FIG. 9 is a conceptual view illustrating a state in which the first frame 310, the second frame 320, and the rotating bending bar 305 are changing from the first state to the second state.

(b) of FIG. 8 is a cross-sectional view and (b) of FIG. 9 is a conceptual view illustrating a state in which a protrusion 323 of the second frame 320 is brought into contact with the locking protrusion 305*b* of the rotating bending bar 305 in the stroke state.

(c) of FIG. 8 is a cross-sectional view and (c) of FIG. 9 is a conceptual view illustrating a state in which the rotating bending bar 305 is rotated by the protrusion 323 of the second frame 320 in the stroke state.

(d) of FIG. 8 is a cross-sectional view and (d) of FIG. 9 is a conceptual view illustrating the first frame 310, the second frame 320, and the rotating bending bar 305 in the second state.

The first frame 310 and the second frame 320 may be changed between the first state and the second state.

Specifically, as illustrated in (a) of FIG. 8, the second frame 320 may be moved in a direction away from the first frame 310 by the above-described driving unit in the first state. Then, the second frame 320 may be continuously moved to allow the first frame 310 and the second frame 320 to be in the second state as illustrated in (d) of FIG. 8.

As described above, since the first frame 310 and the second frame 320 are coupled to the first body 210 and the second body 220, respectively, when the first frame 310 and the second frame 320 form the second state, the first body 210 and the second body 220 may also form the second state.

A direction in which the relative rotation of the first body 210 and the second body 220 with respect to each other is reduced by the rotating bending bar 305 is a direction forming an angle with a direction in which the first body 210 and the second body 220 are moved in a process of changing between the first state and the second state.

In detail, a direction in which the first frame 310 and the second frame 320 are changed between the first state and the second state is a direction in which the first frame 310 and the second frame 320 are moved left and right in the drawing. Here, a direction in which the first frame 310 and the second frame 320 are rotated relative to each other is a direction forming an angle with the left and right direction in the drawing.

Referring to (a) to (d) of FIG. 8 and (a) to (d) of FIG. 9, when a force is applied in a direction F in which an end portion of the first body 210 faces the rear surface of the flexible display device 200 in the second state, a force to be rotated in the direction R forming an angle with a direction in which the first body and the second body are changed between the first state and the second state is generated.

Here, as illustrated in (d) of FIG. 8 and (d) of FIG. 9, the rotating bending bar 305 couples the first frame 310 and the second frame 320 to each other to prevent the first body 210 and the second body 220 from being relatively moved in the above-described direction. That is, a moment generated around the rotating bending bar 305 may be absorbed by the rotating bending bar 305.

Meanwhile, surfaces of the first frame 310 and the second frame 320 respectively facing each other may be disposed adjacent to each other to maintain a parallel state when the first frame 310 and the second frame 320 are moving between the first state and the second state. Specifically, referring to (a) to (d) of FIG. 8 and (a) to (d) of FIG. 9, the surface 311 of the first frame and the surface 321 of the second frame maintain a parallel state when changing between the first state and the second state.

Here, the locking protrusion 305*b* of the rotating bending bar 305 may protrude more toward the second frame 320 than a height of the surface 311 of the first frame on the rotation shaft 305*a*. Specifically, referring to (a) of FIG. 8, the locking protrusion 305*b* protrudes higher than the surface 311 of the first frame and is disposed close to the second frame 320.

In addition, the recessed portion 320*a* recessed inward from the surface of the second frame 320 corresponding to a protruded height of the locking protrusion 305*b* is formed on the second frame 320. As described above, the recessed portion 320*a* is recessed inward so that the second frame 320 is not caught by the protruded locking protrusion 305*b* when the second frame 320 is moved. Accordingly, the locking protrusion 305b is not caught by the second frame 320 at an initial stroke state, that is, at a beginning of a transition from the first state to the second state.

The second frame 320 includes the protrusion 323 engaged with the locking protrusion 305b when the first body 210 and the second body 220 are changed between the first state and the second state. Specifically, as illustrated in (a) to (d) of FIG. 8 and (a) to (d) of FIG. 9, the second body 220 may be changed from the first state to the second stated while passing through the stroke state and moving away from the first body 210.

As described above, the locking protrusion 305b protrudes outward from the surface 311 of the first frame. In addition, the protrusion 323 of the second frame 320 protrudes from the surface 321 of the second frame so as to be caught by the locking protrusion 305b described above. Here, the protrusion 323 may be considered not protruding from the surface 321 of the second frame, but relatively protruded due to the recessed portion 320a recessed from the surface 321 of the second frame.

The rotating bending bar 305 is rotated as the locking protrusion 305b is caught by the protrusion 323. Specifically, referring to (b) and (c) of FIG. 8 and (b) and (c) of FIG. 9, the protrusion 323 of the second frame 320 is caught by the locking protrusion 305b of the rotating bending bar 305 to rotate the rotating bending bar 305.

In addition, the protrusion 323 of the rotating bending bar 305 may be disposed at a rear end of the recessed portion 320a. As the second frame 320 is moved, the locking protrusion 305b is not caught by the second frame 320 when the locking protrusion 305b passes through an area of the recessed portion 320a of the second frame 320. And, when the second frame 320 continues to move to a state closer to the second state, the protrusion 323 of the second frame 320 disposed at the rear end of the recessed portion 320a presses the locking protrusion 305b of the rotating bending bar 305 so that the rotating bending bar 305 is caught by the protrusion 323.

When the rotating bending bar 305 is rotated, an end portion of the locking hook 305c is rotated from the first frame 310 toward the second frame 320. Specifically, as illustrated in (b) and (c) of FIG. 8 and (b) and (c) of FIG. 9, when the locking protrusion 305b is caught by the protrusion 323 to rotate the rotating bending bar 305, the end portion of the locking hook 305c is rotated from the first frame 310 toward the second frame 320.

The second frame 320 is formed with the insertion hole 320b into which the locking hook 305c to be rotated can be inserted. Specifically, referring to (d) of FIG. 8 and (d) of FIG. 9, when the locking protrusion 305b is pressed and rotated by the protrusion 323, the locking hook 305c is rotated toward the second frame 320. Here, the locking hook 305c may be inserted into the insertion hole 320b formed in the second frame 320. That is, the rotating bending bar 305 is changed from the stroke state to the second state and is rotated so that at least a part of the rotating bending bar 305 is inserted into the second frame 320.

The insertion hole 320b in the second frame 320 may be disposed at the rear end of the protrusion 323 so that the locking hook 305c may be inserted into the insertion hole 320b while the first body 210 and the second body 220 move from the first state to the second state. Specifically, as the protrusion 323 presses the locking protrusion 305b to rotate the rotating bending bar 305, the locking hook 305c is rotated toward the second frame 320. Here, the insertion hole 320b is disposed at the rear end of the protrusion 323 so that the locking hook 305c can be stably inserted into the insertion hole 320b of the second frame 320.

In this case, a length of the insertion hole 320b may correspond to a length from the locking protrusion 305b of the rotating bending bar 305 to the locking hook 305c. Specifically, when the length of the insertion hole 320b is short, the locking hook 305c may not be inserted into the insertion hole 320b due to the locking hook 305c being caught by the second frame 320 while the rotating bending bar 305 is rotated. And, when the length of the insertion hole 320b is too long, a time duration since the locking hook 305c starts rotating until the second frame 320 is inserted into a lower portion of the locking hook 305c increases, which may cause the rotation bending bar 305 to be rotated in reverse.

Therefore, it is preferable that the length of the insertion hole 320b is provided in a length in which the locking hook 305c is not caught while the rotating bending bar 305 is rotated, and a body plate 322 of the second frame 320 is drawn into the lower portion of the locking hook 305c immediately after the locking hook 305c is completely rotated.

At least a part of the body plate 322 of the second frame 320 may be drawn into a lower portion of a bent end of the locking hook 305c rotated as the first body 210 and the second body 220 are in the second state. In other words, as the body plate 322 of the second frame 320 is inserted into the lower portion of the locking hook 305c, the first body 210 and the second body 220 may achieve the second state.

Specifically, the body plate 322 of the second frame 320 is inserted from the end portion of the locking hook 305c to a point in a length before the locking hook 305c is bent.

At least a part of the body plate 322 of the second frame 320 is inserted into the lower portion of the locking hook 305c, whereby the first frame 310, the second frame 320, and the rotating bending bar 305 are coupled to one another. In particular, since a supporting area 325 of the second frame 320 supports the rotation shaft of the rotating bending bar 350, when a moment acts in a direction same as R illustrated in (d) of FIG. 9, the first frame 310 and the second frame 320 do not rotate by the moment but the rotating bending bar 305 may absorb the moment.

And, the first body 210 and the second body 220 may achieve the second state before the body plate 322 of the second frame 320 is brought into contact with a bent portion of the locking hook 305c.

When the body plate 322 of the second frame 320 does not achieve the second state even after the body plate 322 is brought into contact with the bent portion of the locking hook 305c, the second frame 320 cannot move further. When the body plate 322 of the second frame 320 is in the second state before being inserted into the lower end of the locking hook 305c, the locking hook 305c and the second frame 320 are not coupled to each other. For this reason, the rotating bending bar 305 cannot absorb a rotation moment generated between the first frame 310 and the second frame 320.

Therefore, achieving the second state before the body plate 322 of the second frame 320 is brought into contact the bent portion of the locking hook 305c is preferable. That is, in the second state, an end portion of the body plate 322 of the second frame 320 is preferably disposed at the lower end of the locking hook 305c. Here, the end portion of the body plate 322 of the second frame 320 disposed at the lower end of the locking hook 305c is a portion of the body plate 322 of the second frame 320 positioned on a rear surface of the insertion hole 320b.

Meanwhile, the protrusion 323 may be disposed on an upper end of the locking protrusion 305b of the rotated rotating bending bar 305 so that the locking protrusion 305b of the rotated rotating bending bar 305 is not rotated in reverse. Specifically, as illustrated in (d) of FIG. 9, the protrusion 323 may be disposed on the upper end of the locking protrusion 305b so that the rotating bending bar 305 which has already been rotated does not rotate in reverse. As a result, a problem in which the rotating bending bar 305 rotated by the protrusion 323 is reversely rotated to obstruct the locking hook 305c from being inserted into the insertion hole 320b may be prevented.

The flexible display device 200 according to an embodiment of the present disclosure may reduce a deviated rotation of the first body 210 and the second body 220 as the rotating bending bar 305 is rotated to couple the first frame 310 and the second frame 320 in the process in which the first frame 310 and the second frame 320 is changed from the first state to the second state and to couple the first body 210 and the second body 220 that are respectively coupled to the first frame 310 and the second frame 320.

Meanwhile, referring to FIGS. 8 and 9, the insertion hole 320b may be provided in plural. Each of the insertion holes 320b may be spaced apart from each other in a direction when the first body 210 and the second body 220 are changed from the first state to the second state. In addition, the protrusion 323 may be disposed between the spaced insertion holes 320b.

Referring to (b) and (c) of FIG. 9, the insertion hole may include the insertion hole 320b and a sub insertion hole 320b'. The sub insertion hole 320b' may provide a space in which the locking protrusion 305b is not caught by the second frame 320 when the rotating bending bar 305 rotates. However, when a depth of the recessed portion 320a is adjusted, the sub insertion hole 320b' may not be provided.

(a) to (d) of FIG. 10 describe a movement in which the first frame 310, the second frame 320, and the rotating bending bar 305 in the second state are changed to the first state.

Specifically, (a) of FIG. 10 illustrates the second state, (b) and (c) of FIG. 10 illustrate the stroke state, and (d) of FIG. 10 illustrates the first state.

In the second state, the second frame 320 may be moved in a direction closer to the first frame 310 by the driving unit ((a) of FIG. 10). And, as the second frame 320 moves closer to the first frame 310, the protrusion 323 of the second frame 320 presses the upper end of the locking hook 305c of the rotating bending bar 305 ((b) of FIG. 10). Accordingly, the locking hook 305c is rotated to rotate the rotating bending bar 305 ((c) of FIG. 10). Subsequently, the second frame 320 is moved closer to the first frame 310.

Since the recessed portion 320a of the second frame 320 is recessed from the surface 321 of the second frame, the locking protrusion 305b of the rotating bending bar 305, which has been returned to its original state, is not pressed by the second frame 320 ((d) of FIG. 10). As such, when the second frame 320 is close to the first frame 310, the first frame 310 and the second frame 320 may be in the first state again.

The aforementioned flexible display device is not limited to the configurations and the methods of the embodiments described above, but all or some of the embodiments may be selectively combined so that various modifications can be made.

What is claimed is:

1. A flexible display device comprising:
   a first body;
   a second body configured to be relatively movable with respect to the first body;
   a flexible display disposed on a front side of the first body and a rear side of the second body, wherein a size of a first area of the flexible display exposed to the front side and a size of a second area of the flexible display exposed to the rear side are variable according to relative movement of the second body with respect to the first body; and
   a rotating bending bar disposed in at least one of the first body or the second body and configured to rotate for reducing the relative movement of the first body and second body when the first body and the second body are relatively moved to be coupled to each other.

2. The device of claim 1, wherein at least a part of the rotating bending bar is inserted into one of the first body or the second body, and the rotating bending bar is disposed at another one of the first body or the second body to reduce a relative rotation of the first body and the second body at a position where the first body and the second body are disposed farthest from each other.

3. The device of claim 2, wherein the flexible display is capable of implementing:
   a first state in which the first body and the second body are located adjacent to each other such that a largest area of the flexible display is exposed to the rear side of the second body;
   a second state in which the first body and the second body move away from each other such that a largest area of the flexible display is exposed to the front side of the first body; and
   a stroke state in which the first state and the second state are interchanged with each other.

4. The device of claim 3, further comprising:
   a first frame coupled to the first body to be moved with the first body; and
   a second frame coupled to the second body to be moved with the second body,
   wherein the rotating bending bar disposed in the first frame is further configured to rotate in the stroke state such that at least a part of the rotating bending bar is inserted into the second frame.

5. The device of claim 4, wherein the rotating bending bar comprises:
   a rotation shaft that is a rotation center of the rotating bending bar;
   a locking protrusion protruding from the rotation shaft toward the second frame; and
   a locking hook protruding from the rotation shaft and bent to extend in a direction away from the second frame.

6. The device of claim 5, wherein the first frame comprises a first groove into which the rotation shaft is inserted, and
   wherein the rotating bending bar is rotated while the rotating bending bar is being inserted into the first groove.

7. The device of claim 6, wherein the rotation shaft is disposed in the first groove, and
   wherein a second groove is formed in the first frame to provide a space in which the locking hook is rotated.

8. The device of claim 5, wherein respective surfaces of the first frame and the second frame facing each other are disposed adjacent to each other and move in a state being parallel to each other when the first frame and the second frame are moved to cause a change between the first state and the second state.

9. The device of claim 8, wherein the locking protrusion protrudes from the rotation shaft toward the second frame more than a height of the surface of the first frame, and wherein a recessed portion recessed inward from the surface of the second frame corresponding to a protruded height of the locking protrusion is formed at the second frame.

10. The device of claim 9, wherein the second frame comprises a protrusion that is locked to the locking protrusion when the first body and the second body are moved to cause a change between the first state and the second state, and wherein the rotating bending bar is further configured to rotate when the locking protrusion is locked to the protrusion.

11. The device of claim 10, wherein the protrusion is disposed at a rear end of the recessed portion.

12. The device of claim 11, wherein an end portion of the locking hook is rotated from the first frame toward the second frame when the rotating bending bar rotates, and wherein the second frame comprises an insertion hole into which the rotated locking hook is inserted.

13. The device of claim 12, wherein at least a part of a body plate of the second frame is inserted into a lower portion of a bent end portion of the rotated locking hook when the first body and the second body are moved to cause a change to the second state.

14. The device of claim 12, wherein the insertion hole is disposed at an end portion of the protrusion to allow the locking hook to be inserted thereinto when the first body and the second body are moved to cause a change from the first state to the second state.

15. The device of claim 12, wherein the insertion hole is provided in plural, and each of the insertion holes is spaced apart from each other in a direction in which the first body and the second body are moving to cause a change from the first state to the second state, and wherein the protrusion is disposed between the spaced insertion holes.

16. The device of claim 3, wherein the relative rotation of the first body and the second body is reduced by the rotating bending bar in a direction forming an angle with a second direction in which the first body and the second body are moved in a process in which the first state and the second state are interchanged with each other.

17. The device of claim 3, wherein the rotating bending bar is disposed in an overlapping area in which the first body and the second body overlap each other in the second state.

\* \* \* \* \*